(12) United States Patent
Schroedl et al.

(10) Patent No.: US 9,598,219 B2
(45) Date of Patent: Mar. 21, 2017

(54) ENCLOSURE

(71) Applicant: ABB Technology OY, Helsinki (FI)

(72) Inventors: Christoph Schroedl, Porvoo (FI); Anssi Lehtonen, Hyvinkää (FI)

(73) Assignee: ABB Technology Oy, Helsinki (FI)

( * ) Notice: Subject to any disclaimer, the term of this patent is extended or adjusted under 35 U.S.C. 154(b) by 0 days.

(21) Appl. No.: 14/790,842

(22) Filed: Jul. 2, 2015

(65) Prior Publication Data

US 2016/0009476 A1    Jan. 14, 2016

(30) Foreign Application Priority Data

Jul. 9, 2014 (EP) .................................... 14176223

(51) Int. Cl.

| | |
|---|---|
| *B65D 81/18* | (2006.01) |
| *H05K 5/02* | (2006.01) |
| *H05K 5/04* | (2006.01) |
| *H05K 7/14* | (2006.01) |
| *B65D 85/68* | (2006.01) |

(52) U.S. Cl.
CPC ............ *B65D 81/18* (2013.01); *B65D 85/68* (2013.01); *H05K 5/0213* (2013.01); *H05K 5/04* (2013.01); *H05K 7/1427* (2013.01); *H05K 7/1432* (2013.01)

(58) Field of Classification Search
CPC ...... B65D 81/18; B65D 85/68; H05K 5/0213; H05K 5/04; H05K 7/1427; H05K 7/1432
See application file for complete search history.

(56) References Cited

U.S. PATENT DOCUMENTS

| | | | |
|---|---|---|---|
| 4,618,071 A | 10/1986 | Vincent | |
| 5,248,848 A | 9/1993 | Kornowski et al. | |
| 5,616,266 A * | 4/1997 | Cooper ................... | F24C 7/06 |
| | | | 219/407 |
| 6,127,663 A | 10/2000 | Jones | |
| 7,692,525 B1 | 4/2010 | Halpin et al. | |
| 2010/0163551 A1 * | 7/2010 | Minoue ................. | H05B 6/101 |
| | | | 219/652 |

FOREIGN PATENT DOCUMENTS

| | | |
|---|---|---|
| CN | 201742674 U | 2/2011 |
| DE | 3425418 A1 | 1/1986 |
| EP | 0186543 A1 | 7/1986 |
| EP | 1729202 A1 | 12/2006 |
| GB | 2201320 A | 8/1988 |

OTHER PUBLICATIONS

European Patent Office, Extended Search Report issued in European Application No. 14176223.7, dated Sep. 26, 2014, 2 pp.

* cited by examiner

*Primary Examiner* — Michael C Miggins
(74) *Attorney, Agent, or Firm* — Taft Stettinius & Hollister LLP

(57) ABSTRACT

An enclosure, wherein the enclosure is at least partly formed of a layered material (3), the inner layer (1) of the layered material being formed of porous metal and the outer layer (2) of the layered material being formed of hygroscopic porous material.

23 Claims, 1 Drawing Sheet

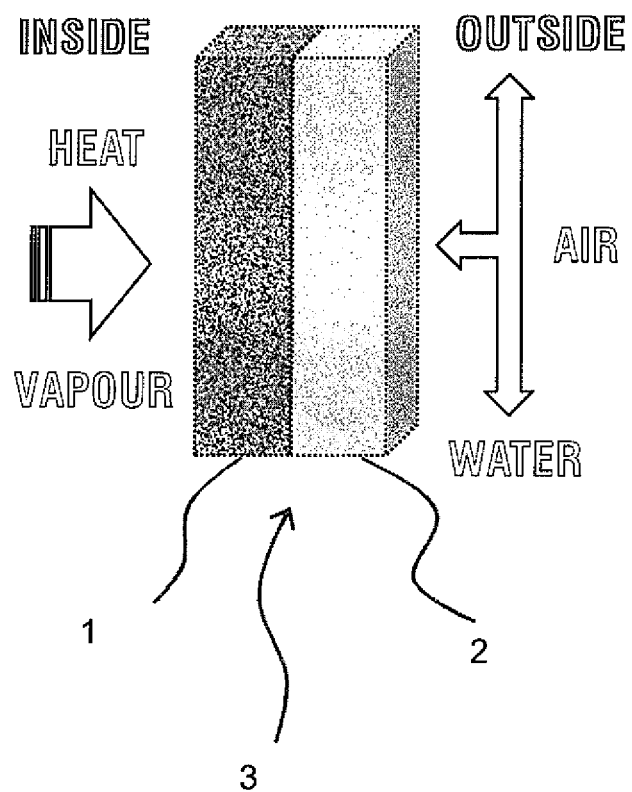

ENCLOSURE

FIELD OF THE INVENTION

The present invention relates to enclosures, and more particularly to enclosures for harsh environmental conditions.

BACKGROUND OF THE INVENTION

Power electronic devices are used in demanding outdoor conditions such as wind and solar generators or electric vehicles (e.g. busses). Power electronics are typically placed in protective cabinet under outdoor conditions and the structure of the outdoor cabinet is not hermetically sealed. However the electronics inside the enclosure demand that temperature and humidity stays within certain limits in order to work. The rate of environmental stress depends on impurities, temperature, relative humidity and materials.

The external environment does not meet the requirements of the optimum operating conditions and those conditions are not in the same way even possible to create as in indoor building. The changing outdoor conditions meaning mainly temperature and humidity as well as outside air contaminants that contribute in degrading the overall lifetime of the device. External environment's rapid temperature and humidity changes cause worst cases in the case of electronics such in a sun rise in the morning and after rain showers or when the outside air warms-up or cools down suddenly.

When device inside outdoor cabinet is continuously switched on there appears no problems with moisture normally because internal heat losses are enough to keep the inside air warmer than outside air. Problems mainly can arise when the device is intermittent switched on (e.g. vehicle) or in a varying weather conditions. The relative humidity is the inverse of the diurnal temperature fluctuations. The diurnal relative humidity is generally at its highest in the morning at sunrise and at its lowest in the afternoon. There are also some exceptions such as in the mountainous slopes where due to valley wind daily fluctuations in humidity can go the opposite way. Relative humidity expresses in percentage of how much water vapor in the air is observed compared to the saturation humidity. As temperature rises, relative humidity decreases and respectively when temperature goes down it increases. In this case, the inside temperature of the enclosure and relative humidity will vary accordingly. In addition, variation in the temperature inside the enclosure causes the outer exterior of the enclosure's surface to breath. Moisture is absorbed inside the enclosure into the components such as printed circuit boards and a variety of plastic surfaces.

Problems caused by moisture are related to corrosion and change of electrical properties of materials or devices which can cause short circuit and damage to the appliance. The moist conditions must be controlled or the device must be conditioned before use after a stop. The problems caused by moisture after switch-off must be solved other way than continuous heating or using dehydrator because the device should not use electricity when it is switched off for economic reasons.

In a closed space almost identical absolute humidity prevails when air is mixed and temperature is stable. Relative humidity (RH) rises when temperature decreases and water molecules start to condense into a liquid to the coldest surface.

Dehumidifier takes advantage of this phenomenon. House dehumidifiers are a common household appliance which reduces the moisture in the air. There are different kinds of dehumidifiers for different kinds of applications, but all of them follow the same principle. It is based on circulating the air through the device and moisture in the flowing air condenses on the cold surface which separates the moisture from the air. This same phenomenon happens also in air conditioner when it chills the air. Dehumidifier is an expensive way to remove moisture. Dehumidifier air filter can clog, it collects condensed water in a bucket and must be (manually) removed from the enclosure. Further, dehumidifiers are equipped with a fan that draws the enclosure air over the cooling coils. As known, fans are electro-mechanical components which can breakdown easily and need service. The evaporator is made up of coils that are located on the back of the dehumidifier unit. Evaporator coils turn cold when the dehumidifier is running and the fan draws the moist air over the coils, allowing the humidity in the air to condense. If air temperature blowing over the coils is too cold, the condensation water on the coils will turn to ice, eventually compromising or ceasing operation (cp. refrigerator).

Extra heating is another common way to reduce moisture effects. The impact of heating is just based on the fact that warmed air can hold more moisture and in consequence relative humidity decreases. Outgoing air is preventing moist air to flow into the enclosure from surrounding atmosphere.

Constantly active electric device has electric losses which generates heat all the time to the surrounding enclosure. This continuous warmer temperature inside enclosure and its immediacy of surrounding air creates an anomalous area with decreased relative humidity. Decreased relative humidity as a result of surrounding air temperature rise moves the device's operating point in the Mollier diagram to the more dry side and corrosion is less. This principle happens only when the heater is turned on and heater or heaters must be always on even when the device is switched off. However, heating consumes a lot of energy and therefore the efficiency of the device decreases.

Electronic dehumidifiers with Peltier kind of heat pumps are mainly used when there is a need for small design. Peltier has poor energy efficiency (low COP value) and same kind of problems than with normal house dehumidifier. It is inapplicable where requirements prohibit e.g. extra 24V consumers.

Ionic membrane dehumidifier uses special membrane as an ionic pump to transfer humidity at a molecular level (hydrogen and oxygen, no liquid water) out of the device enclosure. Ionic membrane dehumidifiers as a new technique are expensive at a low dehumidification capacity which is bad on the long run. The good redeeming features are that it uses small amount of electricity, there are no moving parts, the process is maintenance free and water is removed in a molecular level (means no liquid water). The effect of the chemical gases transferred possibly from the environment of use to the membrane is still unknown.

Silica gel beads are widely used as a desiccant which absorbs moisture from the surrounding environment. Moisture absorption can be of physical or chemical nature. Physical absorption in materials can happen through dissolution, diffusion or at the material surface by adsorption. Adsorption is based on weak forces of attraction (van der Waals forces, electrostatic interactions). In desiccant adsorption weak forces create weak bonds which can be dissolved by heating (reversible process).

Silica gel is a porous desiccant and water vapor is moved by multilayer adsorption and capillary condensation. Time of operation depends on the humidity of environment and the amount of silica. Silica gel bead can collect only certain amount of water. Silica gel bead must be placed inside the electric enclosure for relative humidity reduction. A reversing process required for regeneration is impossible without releasing moisture back into the electric equipment enclosure.

BRIEF DESCRIPTION OF THE INVENTION

An object of the present invention is to provide an enclosure of an electronic device so as to solve the above problems. The object of the invention is achieved by an enclosure which is characterized by what is stated in the independent claim. The preferred embodiments of the invention are disclosed in the dependent claims.

The invention is based on the idea of using an enclosure comprising a layered material or structure. The inner layer of the material or structure is formed of porous metal and the outer layer is formed of hygroscopic porous material. The layered structure allows air and moist to pass out from the enclosure. The outer layer of the structure is able to hold the moist and condense it to water in the outer surface of the enclosure.

An advantage of the enclosure of the invention is that the water vapour and other moist are delivered out from the enclosure through the layered structure. When an electronic device inside the enclosure generates heat, the increased pressure inside the enclosure pushes air and moist out from the enclosure through the layered structure. When the electronic device is again cooling down, the moist and water vapour is not able to enter the enclosure due to the design of the layered structure. When the pressure inside the enclosure is not high enough for pushing the air out from the enclosure, a blower or a fan may also be used for generating required pressure difference.

As the moist is removed from the enclosure the risk of corrosion of the electronic device inside the enclosure is minimized. The moist and water vapour is removed from the enclosure without any additional energy or chemical substances using only the heat generated by the electronic device. According to an embodiment, the electronic device that generates heat is an electric heater. Such a heater may be used when the enclosure is used in harsh conditions and a device inside the enclosure is not generating enough heat for the operation of the enclosure.

According to an embodiment, the enclosure is a sealed enclosure in which at least a part of the walls or ceiling is formed of the layered structure. The surface area of the layered structure depends on design preferences.

BRIEF DESCRIPTION OF THE DRAWINGS

In the following the invention will be described in greater detail by means of preferred embodiments with reference to the attached [accompanying] drawings, in which FIG. 1 is shows a simplified view of the layered structure used in the invention.

DETAILED DESCRIPTION OF THE INVENTION

According to the invention, the enclosure is at least partly formed of a layered material 3. The inner layer 1 of the layered material is formed of porous metal and the outer layer 2 of the layered material is formed of hygroscopic porous material. Thus, the enclosure that is adapted to enclose an electronic device is at least partly formed of a layered material 3 such that the layer of porous metal is facing the interior of the enclosure and the layer of hygroscopic porous material is on the outside surface of the enclosure.

The enclosure of the invention can be of any type or size. The enclosure may hold a low-power electronic device or a megawatt size electronic device. The enclosure may be a cabinet, a container, a casing or any other structure that can be adapted to hold an electronic device inside the structure.

As the enclosure is formed at least partly of a layered material 3, it provides for natural or artificial breathing in a controlled manner. The inner layer 1 formed of porous metal acts as stable construction material for the enclosure and at the same time as a heat conductor. The porous metal is preferably porous aluminum, porous copper, porous steel or porous iron, for example. Porous aluminum is used in the following as an example of the suitable material.

The porous aluminum conducts the heat to the outer surface, and moves from the outer surface to the surrounding air by radiation and conduction. The inner layer's good thermal conductivity, thermal mass and large internal surface of the porous aluminum are favorable properties for a heat exchanger.

The outer layer 2 formed of hygroscopic porous material is preferably a ceramic film coating, such as $SiO_2$, $TiO_2$, $SnO_2$ or $ZrO_2$ ceramic film coating or a coating having similar properties than the above ceramic coatings.

As the layered materials are porous, the layers allow to transfer heat also through convection. The amount of thermal convection can be controlled by the manufacturing process of the inner layer 1, and the porous aluminum acts as a flow controlled layer.

In the following, the operation of the invention and manufacture of the layered material is described in more detail.

The inner layer 1 of the layered material 3 used in the enclosure of the invention is preferably porous aluminum and manufactured through casting. Aluminum is extremely firm, lightweight having a cellular structure, thermally conductive and generally used material. High porosity aluminum is permeable over the entire surface. Porous aluminum manufacturing is a standard process and has been used in a wide range of applications such as filters, silencers and heat exchangers.

An advantage of porous aluminum is easy formability of the material. The porous aluminum can be produced according to specifications and thereby design of the enclosure is free. Porous aluminum provides also extremely firm structure and resistance against deformation due to cast structure. The manufacturing technology of porous aluminum is also cost-effective. In the manufacturing process aluminum is casted together with salt crystals in to desired shape and size. After the aluminum has been cooled, the salt crystals are washed away leaving the wanted porosity to the aluminum.

The porosity of the aluminum can be selected depending on the design. The range of pore size in the aluminum used in the invention is up to 200 µm. Due to high volume porosity (large inner surface) they porous aluminum is suitable for being used as heat exchanger in the convective heat transfer.

The outer layer 2 of the layered material 3 used in the enclosure of the invention consists preferably of $SiO_2$ polymer ceramic produced in a well-known sol-gel process. The outer layer is preferably a ceramic film coating obtained with the sol-gel process. Although sol-gel process is preferred in forming the outer layer, other possibilities exist in producing the desired layer.

Thanks to its high porosity and amorphous structure, $SiO_2$ polymer ceramics can adsorb and transport vapor very well with capillary motion. Further, $SiO_2$ polymer ceramics are well-known for their hygroscopic properties. The pore size of the outer layer is in the range of 5 to 10 μm. Thus according to an embodiment, the pore size of the outer layer is smaller than the pore size of the inner layer.

The enclosure of the invention utilizes natural processes inevitably taking place during cyclic loading operation of the electrical device. Hence it is very reliable and manages to operate without complicated equipment such as motors or valves and involved control software making it in particular suitable for electric vehicle operations, for instance. In the following, a cyclic operation is described in connection with a frequency converter that is enclosed in the enclosure of the invention.

1. Start of Operation

Due to increasing heat losses accumulating inside the enclosure, temperature and consequently pressure will build up inside the enclosure. The enclosure of the invention acts as a smart filter and allows air to flow out of the mechanical housing. This results in a combined mass flow of air and vapour. Thanks to this process potential condensation water is transported to outside environment.

2. Steady Operation

As the frequency converter is operated continuously, the pressure between the inside of the enclosure and the surrounding atmosphere is maintained at equilibrium state. Mass flow effects are now minimal due to an already diminished air/vapour density inside the enclosure and heat continuously fed from electronic components is predominantly dissipated by conductive and radiative processes. At this moment, there is no risk of condensation of water inside the enclosure.

3. Slowing Down of the Motor

Heat losses will become less due to the slowing operation that is due to the slowing of the motor driven by the frequency converter, for example. The electronic equipment starts to cool and pressure is reduced. This will cause a backwards flow of air and vapor into the cabinet. However, due to the enclosure of the invention, air will be allowed to flow back inside of the enclosure meanwhile vapor is kept back at the outside surface. Potential condensation water is filtered that way and accumulates on the outer layer of the layered structure depending on ambient conditions. When the drive is is switched off now, the absolute water inside of the cabinet will be drastically reduced and the risk of condensation and all its consequences significantly mitigated.

During a repetition of the cyclic operation, the water accumulated to the outside surface of the layered structure will be evaporated using the once again increasing heat losses and the smart filter is regenerated at the same time. The evaporation of the water will provide an additional cooling effect for the enclosure. This mechanism is further enhanced by the initial airtightness resulting from condensed water molecules inside the porous outer layer of the invention that impede airflow and amplify heat accumulation inside the structure. The latter substantially contributes to an efficient regeneration process.

The layered structure of the enclosure of the invention thus provides a path for air when the pressure inside the container gets higher than the ambient temperature. When the heated air flows out of the enclosure, the air flows through the pores of the aluminum. The heat is transferred to the aluminum as the volume of the pores is substantially high. That is to say that on its way out the air is in contact with large amount of porous metal. The heat is transferred also by convection as the heated air flows out of the enclosure.

The enclosure of the invention is preferably substantially sealed enclosure in such a manner, that it provides a high IP-class protection. As the casing is substantially sealed, the removal of humidity can be accomplished with the above described manner.

The electronic device inside the enclosure is preferably attached directly to the inner layer of the layered structure in such a manner, that the heat generated by the electronic device is transferred effectively to the inner layer of the layered structure. The porous metal has a large thermal mass and conducts heat well. The heat is dissipated to the outside by means of the large internal surface area of the porous metal, such as aluminum.

As mentioned above, the enclosure of the invention is not necessarily completely formed of the layered material 3. The amount of the layered material 3 depends on the intended use of the device and the surrounding in which the device is used. It is understood that as one or multiple of parts of the enclosure are formed from the layered material, the rest of the enclosure can be any known type of enclosure. The layered material may be used in any part of the enclosure that separates the interior of the enclosure from the surrounding atmosphere. The layered structure may be used in the walls, top or bottom of the enclosure.

In the above, the enclosure of the invention is described in connection with a preferred embodiment in which a heat generating electronic device is generating the heat required for the described operation of the enclosure. However, according to another embodiment, the heat generating device may be an electrical heater device. Further, the enclosure may include a blower, a fan or other similar device for moving the air from the enclosure to the outside of the enclosure. The heater device and the blower are needed in cases where an electronic device that is protected against the harsh conditions by the enclosure, is not generating heat by itself for the natural breathing to take place. In such a case the moist is removed from the enclosure using the blower or similar device. Further, the moist or vapor is removed from the outer surface by heating the enclosure with the electric heater so that the filter is regenerated. When using an additional heater, the inside of the enclosure may be kept substantially dry by removing the moist in above described manner periodically. Although the additional heater consumes electricity, the temperature of the enclosure is not kept at an elevated temperature thereby providing more efficient moist removal than in the previously known enclosures.

In addition to the ability to remove moist and vapor from the enclosure, the layered structure used in the enclosure of the invention has other benefits. The porous metal used in the inner layer of the structure provides a noise reducing surface as the sound waves are mitigated through energy absorption into the inner structure. The sound waves are also scattered and partially cancelled from the large and uneven porous aluminum inner layer. Porous aluminum is already used in pneumatic devices to reduce acoustic energy of flowing exhaust air. The reduction of noise is beneficial when the electronic device is used in a vehicle, for example.

A further advantage of the enclosure of the invention is the ability of the enclosure to mitigate rapid pressure changes due to arcs in the enclosure. Arcing can take place inside the enclosure due to malfunction of electrical components. It is known to design enclosures or cabinets to have a hatch or similar opening for releasing sudden pressure peaks from the enclosure.

In the present invention, the pore structures of the layered materials mitigate the pressure in a controlled manner as the kinetic energy of the air molecules is absorbed into heat when the air molecules interfere with the porous metal as a result of its high resistivity against pressure waves.

This simplifies the design of the enclosure with respect to pressure control as the pressure relief mechanisms can be assembled near the places that are most prone to arcing. The placement of opening hatches is somewhat limited by the mechanical design of the device and the surroundings of the device. The layered material used in the invention can be placed freely to the enclosure without considering the effect of any opening hatches.

The layers are preferably made of different pore structures/diameters. Meanwhile the small pores of the silica outer layer are suitable enough for the standard operation pressure balancing, the multiple times enlarged pores of the porous aluminum inner core of the filter enclosure allow for a fast pressure mitigation inside the cabinet not compromising mechanical stability and operator safety. In the event of sudden pressure increase, the outer layer is simply blown to nonhazardous dust in case of an arc event. The cabinet can be reused after the arc event after re-applying the outer layer, since the destructiveness of the arc event itself is dramatically reduced. This is, because the pressure wave intensity decays very quickly as a result of strong dampening effects taking place in the filter enclosure. Hence, risk of component damage is reduced meanwhile operator safety can be guaranteed without use of pressure release hatches or mechanical bracings.

Instead of using porous metal obtained by casting, the porous metal may be achieved using other manufacturing technologies. Other type of porous metal is metal foam which is known as such.

As mentioned above, the pore sizes of both inner and outer layer of the layered material can be selected during the manufacture of the materials. Further, in addition to pore sizes, also the density of the pores may be changed. The size and density of the materials are selected to use according to specific design similarly as the thickness of the layers. Typically the thickness of the porous metal is in the range of 0.5 cm to 3 cm and the thickness of the hygroscopic porous material is in the range of 0.2 mm to 10 mm.

It will be obvious to a person skilled in the art that, as the technology advances, the inventive concept can be implemented in various ways. The invention and its embodiments are not limited to the examples described above but may vary within the scope of the claims.

The invention claimed is:

1. An enclosure adapted for outdoor conditions with changing temperature and humidity, the enclosure enclosing a power electronic device that is damageable from moisture within the enclosure, wherein the enclosure is at least partly formed of a layered material, the inner layer of the layered material being formed of porous metal and the outer layer of the layered material being formed of hygroscopic porous material, wherein moisture within the enclosure is pushed out through the layered material by heat generated within the enclosure, the moisture condensing to water on the outer layer, the power electronic device thereby being protected from being damaged by moisture within the enclosure.

2. An enclosure according to claim 1, wherein the enclosure is a substantially sealed enclosure.

3. An enclosure according to claim 1, wherein the enclosure comprises side walls, and wherein one or more of the side walls are formed of the layered material.

4. An enclosure according to claim 1, wherein the enclosure comprises side walls, and wherein one or more portions of one or more of the side walls are formed of the layered material.

5. An enclosure according to claim 1, wherein the enclosure comprises a roof/ceiling, and wherein the roof/ceiling is formed at least partly of the layered material.

6. An enclosure according to claim 1, wherein the power electronic device is attached directly to the inner layer and is in a thermal contact with the inner layer of the layered material.

7. An enclosure according to claim 1, wherein the enclosure is a substantially sealed enclosure.

8. An enclosure according to claim 1, wherein the enclosure is not adapted to enclose a fan, pressure within the enclosure being generated by the heat generated by the power electronic device to push out the moisture.

9. An enclosure according to claim 1, wherein the porous metal is selected from the group comprising porous aluminium, porous copper, porous steel, porous iron and the mixtures of the previous porous metals.

10. An enclosure according to claim 9, wherein the hygroscopic porous material is a ceramic film coating applied to the surface of the porous metal.

11. An enclosure according to claim 1, wherein the hygroscopic porous material is a ceramic film coating applied to the surface of the porous metal.

12. An enclosure according to claim 11, wherein the ceramic film coating is a coating comprising $SiO_2$, $TiO_2$, $SnO_2$, $ZrO_2$ or any other substances having similar properties.

13. An enclosure according to claim 1, wherein the electronic device is a heat generating electronic device.

14. An enclosure according to claim 13, wherein the electronic device is a frequency converter.

15. An enclosure according to claim 13, wherein the electronic device is an electronic heater.

16. An enclosure according to claim 15, wherein the enclosure further comprises a fan or a blower for producing a pressure gradient between the inside and the outside surrounding the enclosure.

17. An enclosure according to claim 1, wherein the heat generated within the enclosure is generated by the power electronic device, and the enclosure is not adapted to enclose a heater.

18. An enclosure according to claim 17, wherein the enclosure is not adapted to enclose a fan, pressure within the enclosure being generated by the heat generated by the power electronic device to push out the moisture.

19. An enclosure according to claim 18, wherein the power electronic device is switched on intermittently.

20. An enclosure according to claim 19, wherein the enclosure is a substantially sealed enclosure and provides a high IP-class protection.

21. An enclosure according to claim 20, wherein the porous metal is cast aluminum.

22. An enclosure according to claim 1, wherein the enclosure is adapted to further enclose a heater.

23. An enclosure according to claim 22, wherein the enclosure is adapted to further enclose a fan.

* * * * *